United States Patent [19]

Fusinski

[11] 4,232,319
[45] Nov. 4, 1980

[54] BROADBAND TRANSMITTING ANTENNA FOR TEST CHAMBER

[75] Inventor: Richard E. Fusinski, Sterling Heights, Mich.

[73] Assignee: General Motors Corporation, Detroit, Mich.

[21] Appl. No.: 75,700

[22] Filed: Sep. 14, 1979

[51] Int. Cl.³ .................. H01Q 1/36; G01R 29/08
[52] U.S. Cl. ............................ 343/703; 343/826
[58] Field of Search ............ 343/703, 711, 712, 713, 343/715, 720, 826, 897

[56] References Cited

U.S. PATENT DOCUMENTS

| | | | |
|---|---|---|---|
| 884,071 | 4/1908 | Cabot | 343/897 |
| 3,179,943 | 4/1965 | Buzbee | 343/792.5 |
| 3,550,145 | 12/1970 | Tai | 343/826 |

Primary Examiner—E. Lieberman
Attorney, Agent, or Firm—Robert M. Sigler

[57] ABSTRACT

A broadband antenna for electromagnetic interference testing within a test chamber of limited dimensions includes a triangular array of tuned, quarter-wavelength monopole antenna elements with a common feed point in a plane parallel to elements defining a ground plane. The tuned elements transmit electromagnetic signals down to a low limiting resonant frequency determined by the longest element and further comprise, with the ground plane elements, a capacitor to transmit longer wavelength signals by a varying electric field between the triangular array and ground plane.

1 Claim, 3 Drawing Figures

BROADBAND TRANSMITTING ANTENNA FOR TEST CHAMBER

BACKGROUND OF THE INVENTION

This invention relates to transmitting antennas and especially to such antennas adapted for electromagnetic interference testing of objects within a test chamber. Such electromagnetic interference or EMI testing is assuming a greater role in the design of electronic controls for motor vehicles as these controls increase in numbers and importance and as the number of possible EMI sources also increases. One type of EMI testing of motor vehicles is accomplished within a test chamber which isolates the testing environment from outside EMI sources and further requires an antenna within the test chamber to transmit the desired EMI signals within the test environment.

A problem with the test arrangement as described above is the limit imposed on the length of a resonant antenna element by the physical dimensions of the test chamber. As a practical matter, it is found that such a test chamber of reasonable size is too small to permit the use of resonant antenna elements which will transmit the lowest desired resonant frequency EMI signals. As an example, a room having a longest horizontal dimension of approximately 23 feet or 8.4 meters permits a resonant quarter-wavelength antenna element having a length of approximately 24 feet or 7.2 meters, and since the element should not approach the shielded walls too closely. This antenna element will transmit a signal having a wavelength no greater than approximately 29 meters or a frequency no lower than approximately 10 MHz. However, in EMI testing of motor vehicles, it is often desirable to transmit at frequencies down to 70 KHz.

Therefore, it is an object of this invention to provide a broadband transmitting antenna for a test chamber which is capable of transmitting signals in a full range of frequencies, with wavelengths extending beyond those possible for tuned elements within the physical dimensions of the test chamber.

SUMMARY OF THE INVENTION

The antenna of this invention uses a plurality of tuned quarter-wavelength monopole antenna elements of progressively decreasing length in a triangular array parallel to the floor of the test chamber together with further elements establishing a ground plane at the floor. The monopole antenna elements are adapted to transmit signals having wavelengths from the highest wavelength desired down to a wavelength determined by the length of the longest of such monopole elements. For signals having even longer wavelengths, the triangular array of antenna elements and the ground plane elements act together as a large capacitor which generates an EMI simulating electric field in the volume defined therebetween. A vehicle placed in this volume may thus be subjected to EMI signals comprising the full range of wavelengths desired.

Further details and advantages of this invention will be apparent from the accompanying drawings and following description of a preferred embodiment.

DESCRIPTION OF THE PREFERRED EMBODIMENT

Figure 1:
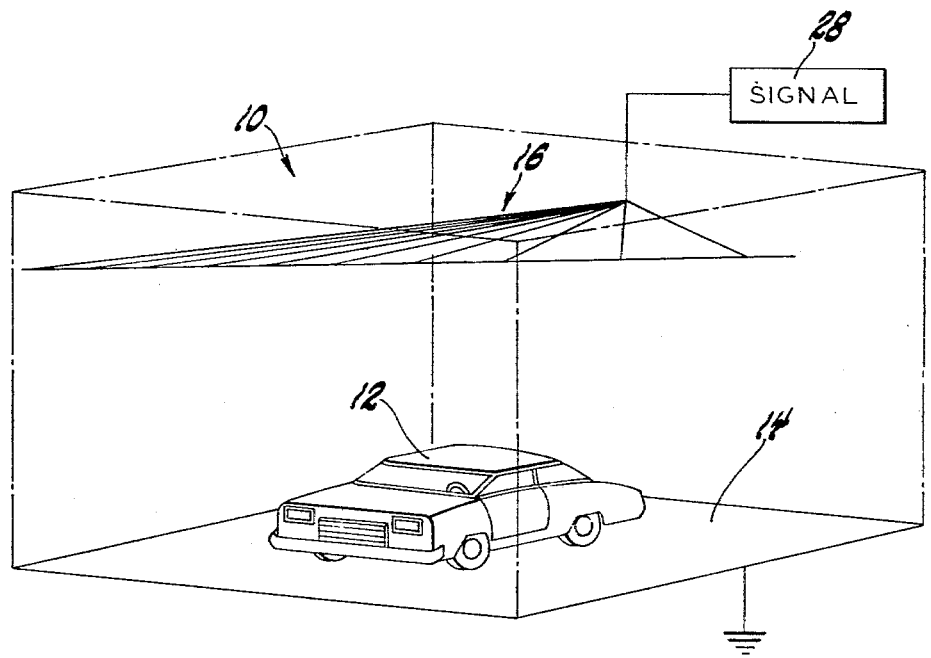
FIG. 1 is a perspective drawing of a test chamber equipped with one embodiment of an antenna according to this invention.

Referring to FIG. 1, a test chamber 10 comprises a room large enough to contain a full size motor vehicle 12. The walls of room 10 may be provided with means to shield the interior volume of the room from external electromagnetic signals and thus isolate the chamber for test purposes. Elements are provided in the floor 14 of room 10 to act as a ground plane for an antenna. These elements may comprise a conducting plate or conducting wires embedded in said floor 14 or any equivalent apparatus.

Figure 2:
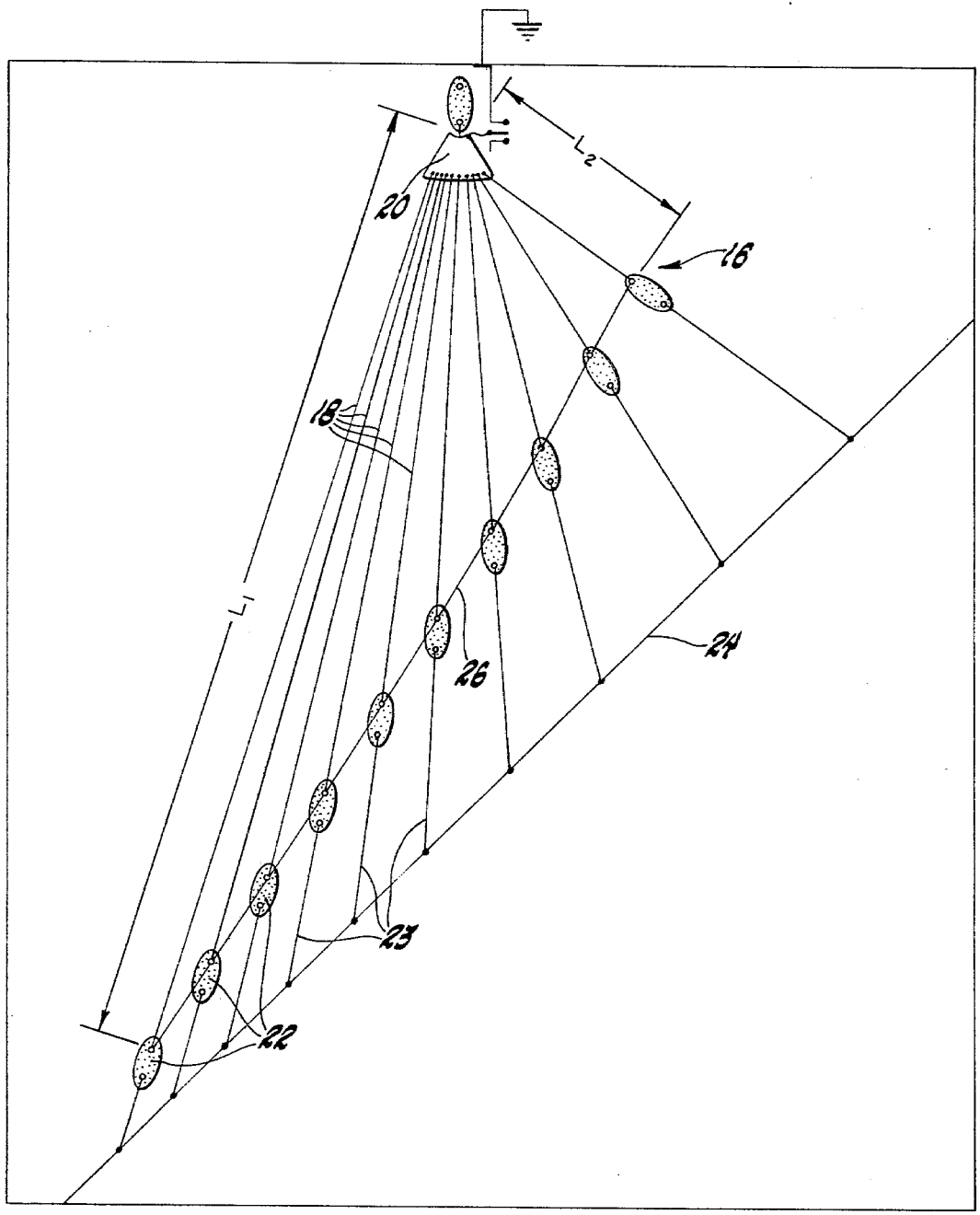
FIG. 2 is a top view of an array of antenna elements for use in the antenna of FIG. 1.

Above floor 14 and parallel thereto is suspended a triangular array 16 of antenna elements which, together with the ground plane elements of floor 14, form an antenna. Triangular array 16 can be seen in more detail in FIG. 2. It comprises a plurality of tuned quarter-wavelength monopole antenna elements 18, each such element 18 itself comprising a conducting wire extending from a common conducting member 20 to an insulator 22. An extension wire 23 extends further from each insulator 22 to a common support wire 24. The lengths of elements 18 vary from slightly more than seven meters for the longest to approximately two meters for the shortest. A conducting wire 26 electrically connects the ends of elements 18 opposite the common member 20. As shown in FIG. 1, signal generating apparatus 28 is provided to generate electrical signals at predetermined frequencies and supply them to the common member 20 of the antenna for transmission by the antenna to the vehicle 12 within the chamber 10.

Since the longest of the tuned quarter-wavelength elements 18 is near 7 meters in length, the lowest resonant frequency of the antenna is approximately 10 MHz. Higher resonant frequencies are obtained from the other, progressively shorter elements 18 and from multiple wavelength resonances on elements 18. The greater the number of elements 18 the smoother the response of the antenna will be within its upper range.

For signals having frequencies lower than the lowest resonant frequency of the antenna, the antenna will not transmit full electromagnetic waves efficiently. However, at these lower frequencies the feed point impedance of the antenna is quite high and represents an effective open circuit to the output of the signal generator 28. The triangular array 16 of elements 18 therefore acts as one electrode of a capacitor, the other electrode being the ground elements in floor 14 of chamber 10. These electrodes are parallel to one another and define a volume therebetween in which vehicle 12 is subject to an electric field. A low frequency signal between 10 KHz and 10 MHz from signal generator 28 will cause an identical low frequency variation in the electric field between the electrodes and will thus produce the same effect in a conducting portion of vehicle 12 as would a transmitted electromagnetic signal at the same frequency. Thus, the triangular array 16 of elements 18 comprise an antenna, with the ground plane elements, which has two modes of operation: a first mode of resonant electromagnetic transmission above a low limiting resonant frequency and a second mode of capacitor electric field signal transmission below that frequency. The full range of desired transmission frequencies is thus obtained in spite of the physical limitations of the test chamber.

Figure 3:
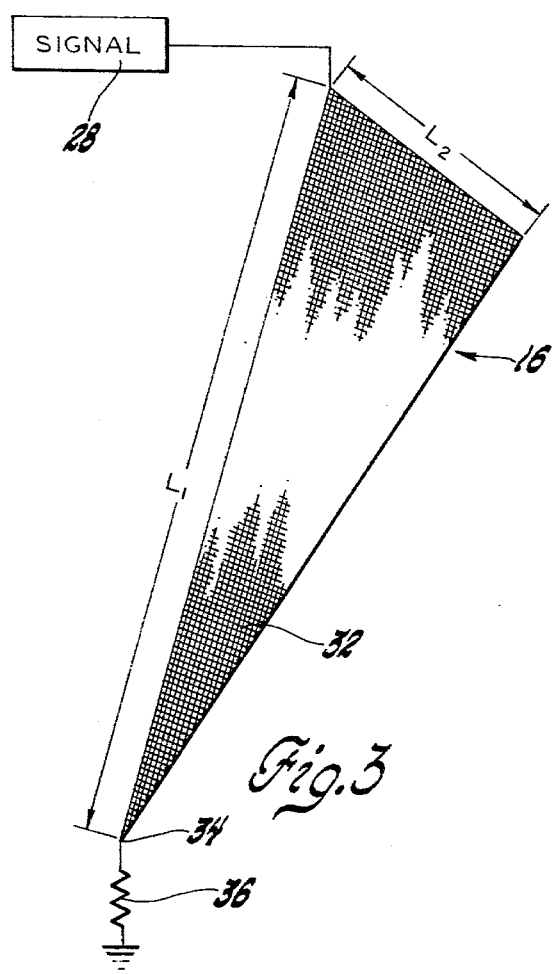
FIG. 3 is a top view of an alternate embodiment of antenna elements which may be substituted for those of FIG. 2 in the antenna of FIG. 1.

FIG. 3 shows another equivalent embodiment of the triangular array 16. It comprises a piece of conducting metal screen or mesh material such as hardware cloth which is cut in the shape and size of the triangular array 16 of FIG. 2. The sides whose lengths are indicated as L1 and L2 correspond to the sides and lengths so indicated in array 16 of FIG. 2; and the corner formed by the junction of these sides comprises the common feed point for the antenna. Element 32 is suspended in test chamber 10 in the same position as the array of elements 18 and works at least as well. In fact, the response from member 32 is even smoother than that from the array of elements 18, due to the large number of effective tuned element lengths found in member 32. In addition, if the opposite end 34 of the longest side L1 is loaded through a 50 ohm resistor 36, the response becomes even smoother and reduces the load which may be placed on signal generating apparatus 28 at certain frequencies due to antenna—chamber interactions. Either embodiment is capable of transmitting signals down to 10 KHz, although the embodiment of FIG. 3 with the 50 ohm resistor has been found to work most satisfactorily, due to its smooth frequency response.

Although several embodiments of this invention are described above, equivalent embodiments will occur to those skilled in the art. Therefore, the scope of the invention should be limited only by the claim which follows.

The embodiments of the invention in which an exclusive property or privilege is claimed are defined as follows:

1. A broadband transmitting antenna adapted for electromagnetic interference testing of objects within a test chamber of physical dimensions smaller than the quarter-wavelength of the longest wave signal transmitted, the antenna comprising, in combination:

first conducting means associated with the floor of said test chamber and effective to establish a ground plane thereat; and second conducting means comprising a plurality of tuned quarter-wavelength monopole antenna elements of progressively decreasing length, said elements being joined at one end in a common feed point and fanning out in a triangular array suspended above and in a plane substantially parallel to the first conducting means, whereby said antenna operates as a tuned quarter-wavelength array for transmitted electromagnetic signals having quarter-wavelengths no longer than the longest monopole antenna element and further operates as a capacitive antenna device in the volume between the first and second conducting means by generating a varying electric field therein having components with quarter-wavelengths longer than the longest monopole antenna element.

* * * * *